United States Patent [19]
Kitahara et al.

[11] Patent Number: 5,648,663
[45] Date of Patent: Jul. 15, 1997

[54] SEMICONDUCTOR STRUCTURE HAVING TRANSISTOR AND OTHER ELEMENTS ON A COMMON SUBSTRATE AND PROCESS FOR PRODUCING THE SAME

[75] Inventors: Nobuko Kitahara, Tama; Tetsuya Kaneko, Atsugi; Takashi Enomoto, Tokyo; Hideyuki Suzuki, Honjo, all of Japan

[73] Assignee: Canon Kabushiki Kaisha, Tokyo, Japan

[21] Appl. No.: 476,283

[22] Filed: Jun. 7, 1995

Related U.S. Application Data

[63] Continuation of Ser. No. 167,117, Dec. 16, 1993, abandoned, which is a continuation of Ser. No. 855,484, Mar. 23, 1992, abandoned, which is a continuation of Ser. No. 523,310, May 21, 1990, abandoned, which is a continuation of Ser. No. 210,205, Jun. 20, 1988, abandoned, which is a continuation of Ser. No. 892,087, Aug. 1, 1986, abandoned.

[30] Foreign Application Priority Data

| Aug. 5, 1985 | [JP] | Japan | 60-171141 |
| Jun. 30, 1986 | [JP] | Japan | 61-153280 |
| Jun. 30, 1986 | [JP] | Japan | 61-153282 |

[51] Int. Cl.$^6$ .............. H01L 29/04; H01L 31/036; H01L 31/0376; H01L 31/20
[52] U.S. Cl. .............. 257/59; 257/61; 257/71; 257/72; 257/296; 257/350; 257/352
[58] Field of Search ............... 357/23.7, 4, 2; 257/57, 59, 61, 71, 72, 291, 293, 296, 350, 352

[56] References Cited

U.S. PATENT DOCUMENTS

| 4,425,572 | 1/1984 | Takafuji et al. | 357/23.7 |
| 4,582,395 | 4/1986 | Morozumi | 357/23.7 |
| 4,609,930 | 9/1986 | Yamazaki | 357/4 |
| 4,646,424 | 3/1987 | Parks et al. | 357/23.7 |
| 4,958,205 | 9/1990 | Takeda et al. | 357/4 |
| 4,963,955 | 10/1990 | Hatanaka et al. | 357/23.7 |

FOREIGN PATENT DOCUMENTS

| 0090661 | 3/1983 | European Pat. Off. | 357/23.7 |
| 56-164578 | 12/1981 | Japan | 357/715 |
| 58-147069 | 9/1983 | Japan | 357/2 |
| 60-66864 | 4/1985 | Japan | 357/4 |
| 60-160170 | 8/1985 | Japan | 357/2 |
| 60-160171 | 8/1985 | Japan | 357/4 |
| 60-211982 | 11/1985 | Japan | 357/4 |
| 60-251667 | 12/1985 | Japan | 357/4 |

*Primary Examiner*—Ngân V. Ngô
*Attorney, Agent, or Firm*—Fitzpatrick, Cella, Harper & Scinto

[57] ABSTRACT

A thin film transistor comprises a gate electrode, an insulating layer and a semiconductor layer formed and laminated on an insulating substrate. The insulating layer and the semiconductor layer have the same planar pattern.

20 Claims, 8 Drawing Sheets

SEMICONDUCTOR STRUCTURE HAVING TRANSISTOR AND OTHER ELEMENTS ON A COMMON SUBSTRATE AND PROCESS FOR PRODUCING THE SAME

This application is a continuation of application Ser. No. 08/167,117 filed Dec. 16, 1993, now abandoned, which is a continuation of application Ser. No. 07/855,484 filed Mar. 23, 1992, abandoned, which was a continuation application of Ser. No. 07/523,310 filed May 21, 1990, abandoned, which was a continuation of application Ser. No. 07/210,205 filed Jun. 20, 1988, abandoned, which was a continuation of application Ser. No. 06/892,087 filed Aug. 1, 1986, abandoned.

BACKGROUND OF THE INVENTION

1. Field of the Invention

This invention relates to a thin film transistor (hereinafter called TFT) and a process for producing the same, particularly a TFT and a process for producing the same which are intended to improve the yield of TFT and simplify the production steps.

The TFT according to the present invention is applicable for, for example, switching transistors, etc. of an active type liquid crystal display device.

2. Related Background Art

FIG. 1 shows a schematic sectional view of TFT of the prior art in an active type liquid crystal display device.

The TFT in this Figure is prepared as follows. First, on an insulating substrate 1 made of glass, etc., a gate electrode 2 and a picture element electrode 3 are formed, and an insulating layer 4 is formed on these electrodes. Subsequently, on the insulating layer 4 is deposited a semiconductor layer and the unnecessary portion is removed by selective etching to form a semiconductor layer 5 for generating channel. Subsequently, after formation of a contact hole 6, the main electrodes 7 and 8 (here, the source electrode 7 and the drain electrode 8) are formed.

When an appropriate voltage is applied on the gate electrode 2 of the TFT thus prepared, a channel is formed in the semiconductor layer 5, wherein TFT becomes the ON-state. Accordingly, if driving voltage is applied on the source electrode 7 of the TFT, driving voltage can be applied on the picture element electrode 3 through the TFT, whereby the liquid crystal (not shown) can be driven at any desired time.

As can be apparently seen from the above description, at least 5 photolithographic steps are required for preparation of TFT of the prior art as described above. That is, they are the respective steps of forming a gate electrode 2, a picture element electrode 3, a semiconductor layer 5, a contact hole 6 and main electrodes 7 and 8. In carrying out these steps, high precision are required for alignment between the gate electrode 2 and the semiconductor layer 5 or between the semiconductor layer 5 and the main electrodes 7 and 8 as well as for dimensions thereof.

However, according to the production process in the prior art, due to the alignment errors in the respective photolithographic steps, there has been the problem that discrepancy in position and dimension of the portions superposed of the photomask surfaces having patterns is liable to occur.

Further, due to a large number of etching steps, the insulating region such as the insulating layer 4 is susceptible to damages to form pinholes therein, whereby there has been also the problem that deterioration of the characteristics of the TFT or leak at the crossed portion between the multi-layer wirings (hereinafter called cross-point) occurs to lower the yield. In the prior art example as described above, the insulating layer 4 suffers from damages in the etching step for forming the semiconductor layer 5 on the insulating layer 4 and the etching step for forming the contact hole 6 on the insulating layer 4, whereby leak occurs between the gate electrode 2 and the source electrode 7 at higher probability to lower the yield of the TFT.

SUMMARY OF THE INVENTION

An object of the present invention is to provide a novel TFT and a process for producing the same which overcome the problems of prior TFT as described above.

Another object of the present invention is to provide a process for producing a TFT which requires a smaller number of steps and gives little alignment error as compared with the prior art.

According to one aspect of the present invention, there is provided a TFT comprising a gate electrode, an insulating layer and a semiconductor layer formed and laminated on an insulating substrate, said insulating layer and said semiconductor layer having the same planar pattern.

According to another aspect of the present invention, there is provided a process for producing a TFT comprising a gate electrode, an insulating layer and a semiconductor layer formed and laminated on an insulating substrate, which comprises forming said gate electrode on said insulating substrate, an insulating layer thereon and further a semiconductor layer thereon by lamination, and then subjecting said insulating layer and said semiconductor layer to patterning at the same time with the same pattern, thereby forming the insulating layer and the semiconductor layer of the thin film transistor.

According to still another aspect of the present invention, there is provided a process for producing a TFT comprising the steps of:

forming a control electrode on an insulating substrate;
laminating successively a first insulating layer, a semiconductor layer and a second insulating layer;
providing an opening portion at the second insulating layer and forming main electrodes through the opening portion; and
subjecting said first insulating layer, said semiconductor layer and said second insulating layer to patterning after formation of the main electrodes.

According to still another aspect of the present invention, there is provided a process for producing a TFT, comprising the steps of:

forming control electrodes on an insulating substrate;
further laminating successively an insulating layer and a semiconductor layer;
forming main electrodes on the semiconductor layer; and
subjecting said insulating layer and said semiconductor layer to patterning after formation of the main electrodes.

DESCRIPTION OF THE PREFERRED EMBODIMENT

Figure 1:
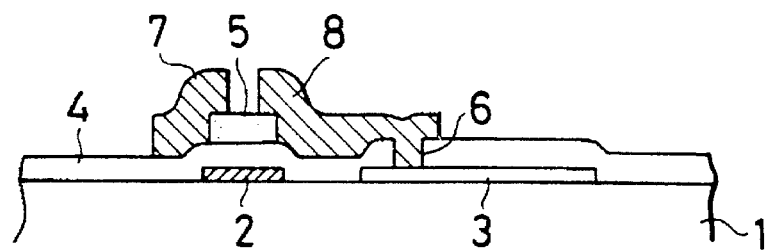
FIG. 1 is a schematic sectional view of a TFT of the prior art in an active type liquid crystal display device.

In the following, the embodiments of the present invention are to be explained in detail by referring to the drawings.

Figure 2A:
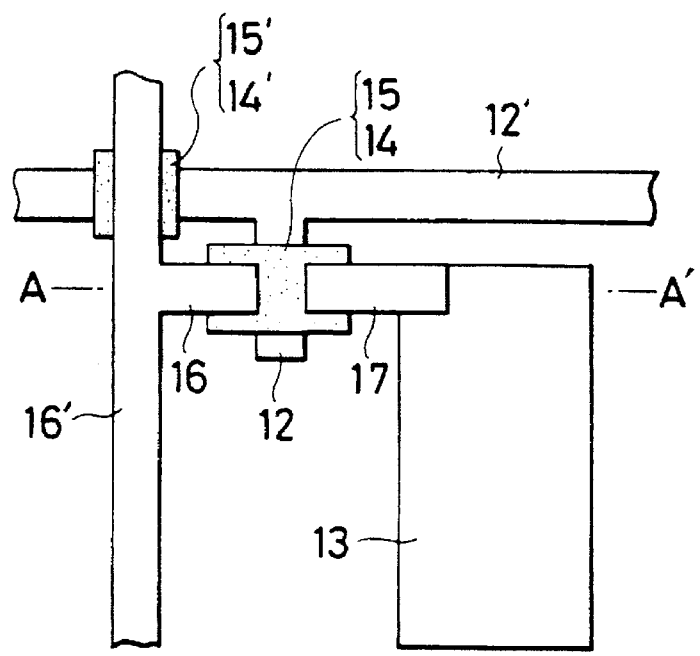
FIG. 2(A) is a schematic plan view of an embodiment of the TFT according to the present invention and FIG. 2(B) is a sectional view taken along the line A–A' thereof.
Figure 2B:
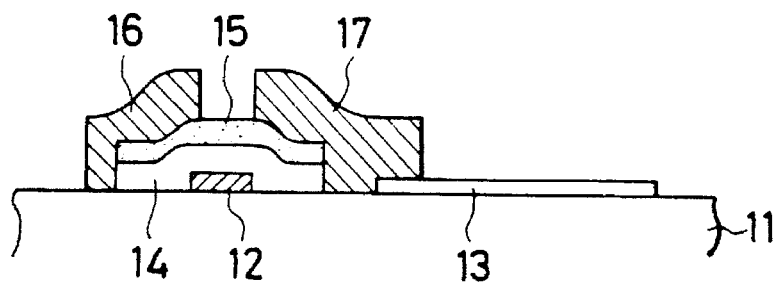

FIG. 2(A) is a schematic plan view of an embodiment of the TFT according to the present invention and FIG. 2(B) a sectional view taken along the line A–A' thereof.

In both Figures, on an insulating substrate 11 such as glass, a gate electrode 12, wiring 12' and a picture element electrode 13 (e.g. ITO, etc.) are formed. On the gate electrode 12 is formed an intermediary insulating layer 14 and a semiconductor layer 15, the last two last-mentioned layers having the same planar pattern. And, on both ends of the semiconductor layer 15, the source electrode 16 and the drain electrode 17 are formed, with the source electrode being connected to the wiring 16' and the drain electrode 17 connected to the picture element electrode 13, respectively.

Although not clearly shown, the cross-points of the wiring 12' and the wiring 16' are separated from each other by the insulating layer 14' and the semiconductor layer 15' interposed therebetween, and the insulating layer 14' and the semiconductor layer 15' are formed by patterning at the same time as formation of the insulating layer 14 and the semiconductor layer 15 of the TFT.

Further, in this embodiment, although not shown in FIGS. 2(A) and 2(B), on the picture element electrode 13 is formed liquid crystal and a common electrode, such as ITO, to form an active type liquid crystal device. Accordingly, by previously applying a driving voltage on the wiring 16' and applying an appropriate voltage through the wiring 12' on the gate electrode 12 to turn on the TFT of the present invention, driving voltage is applied to the picture element electrode 13, whereby the liquid crystal can be driven by the electric field between the picture element electrode and the common electrode.

Thus, this embodiment is simplified in structure as compared with the prior art example as shown in FIG. 1. Further, when a liquid crystal display device is constructed as described above, the voltage for driving the liquid crystal can be made smaller because there is no insulating layer on the picture electrode. This alleviates the load on the driving circuit power source.

Next, the process for producing TFT according to the present invention is to be explained.

Figure 3A:
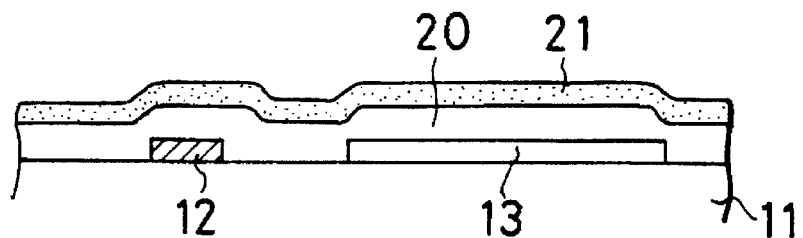
FIGS. 3(A)–3(C) are schematic illustrations of the production steps showing an embodiment of the process for producing TFT according to the present invention.
Figure 3B:
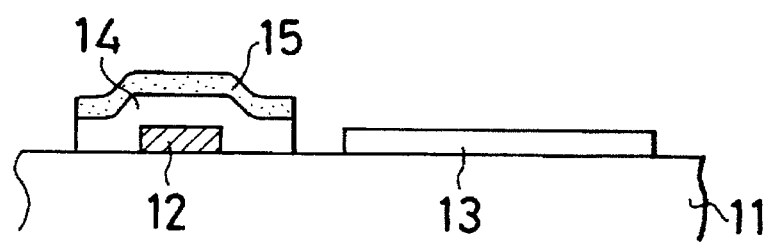
Figure 3C:
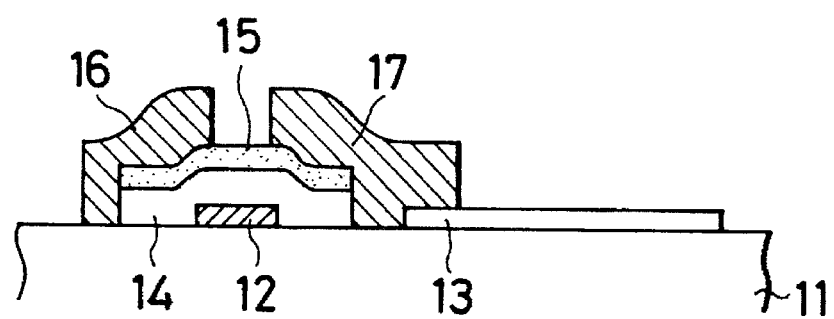

FIGS. 3(A)–3(C) are schematic illustrations of the production steps showing an embodiment of the process for producing a TFT according to the present invention.

First, as shown in FIG. 3(A), on an insulating substrate 11 are formed a gate electrode 12, a wiring 12' and a picture element electrode 13. However, when the picture element electrode 13 is formed of a material different from the electrode 12, etc. (for example, the gate electrode 12, etc. is made of polycrystalline silicon and the picture element 13 made of ITO), it is necessary to perform patterning in separate steps, respectively. Subsequently, an insulating layer 20 such as $SiO_2$, and further a semiconductor layer 21 such as polycrystalline silicon, amorphous silicon, etc. are formed by lamination.

Next, as shown in FIG. 3(B), the insulating layer 20 and the semiconductor layer 21 are subjected to patterning with the same pattern to form an insulating layer 14 which becomes the gate insulating film of the TFT and a semiconductor layer 15 which becomes the channel generating region of the TFT. During this operation, the insulating layer 14 and the semiconductor layer 15 are subjected to patterning so as to be separated from the pattern of the picture element electrode 13. Also, although not shown in the drawing, simultaneously with patterning, an insulating layer 14' and a semiconductor layer 15' are formed on the portion which becomes the cross-point on the wiring 12'.

As the next step, as shown in FIG. 3(C), a metal or polycrystalline silicon for an electrode is deposited and a source electrode 16, a wiring 16' and a drain electrode 17 are formed by patterning. The drain electrode 17 is connected to the picture element electrode 13.

In this embodiment, the semiconductor layer 15 is sufficiently larger than the width of the electrode 12 and also no step of providing a contact hole as practiced in the prior art is required, and therefore the process will receive influences of the positional discrepancy in patterns through alignment errors with difficulty. Therefore, the TFT can be produced without requiring high precision, whereby the production steps can be simplified.

Also, while no selective etching step of the semiconductor layer 15 and no etching step for formation of a contact hole are required in this embodiment, even if such etching may be effected, no damage will be received at all, because the insulating layers 14 and 14' are protected with the semiconductor layers 15 and 15'. Accordingly, there is little possibility of, for example, a leak between source and drain, whereby production yield of the TFT can be markedly improved.

Having explained this embodiment by referring to the case when employed for an active type liquid crystal display device, this is of course not limitative of the present invention, but the present invention is widely applicable as active devices as a matter of course.

FIGS. 4(A)–4(E) are longitudinal sectional views of the production steps of another embodiment of the present invention.

Figure 4A:
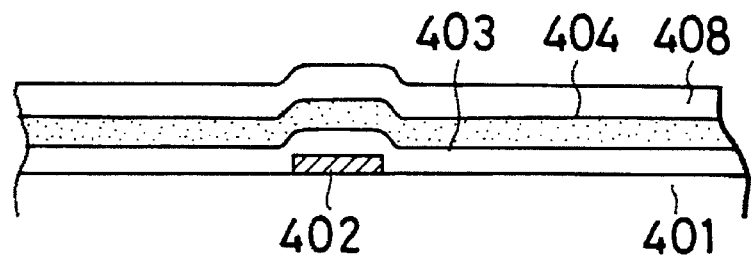
FIGS. 4(A)–4(E) are schematic longitudinal sectional views of production steps showing another embodiment of the process for producing TFT according to the present invention.

First, as shown in FIG. 4(A), on an insulating substrate 401 is formed a gate electrode 402 which is the control electrode. On the gate electrode 402 and the insulating substrate 401 is formed a first insulating layer 403 such as of silicon nitride, silicon oxide, etc. A semiconductor layer 404 such as of polycrystalline silicon, amorphous silicon, etc. is formed thereon, followed further by the formation of a second insulating layer 408 such as of silicon nitride, silicon oxide, etc. to further insulate and protect the TFT.

Figure 4B:
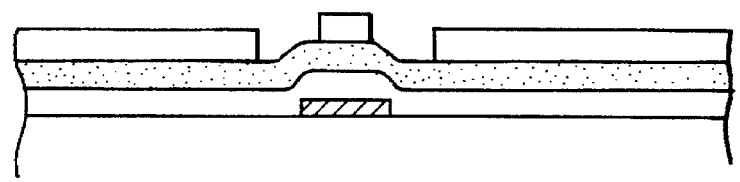

Next, as shown in FIG. 4(B), an opening portion for connecting a source electrode and drain electrode to the semiconductor layer 404 as described hereinafter is provided.

Figure 4C:
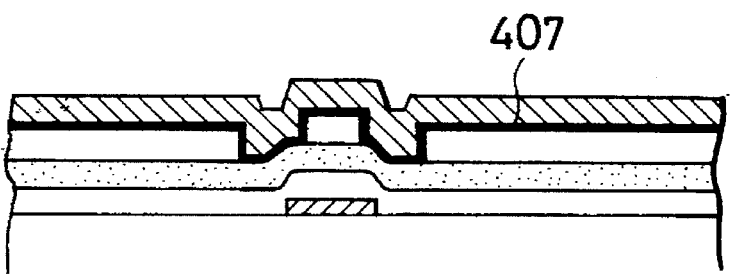

Next, as shown in FIG. 4(C), an impurity semiconductor layer 407 doped with, for example, an element such as phosphorus, is formed which makes the semiconductor layer 404 ohmic contact with the source electrode and the drain electrode. Furthermore, an electro-conductive layer for an electrode is formed by deposition.

Figure 4D:
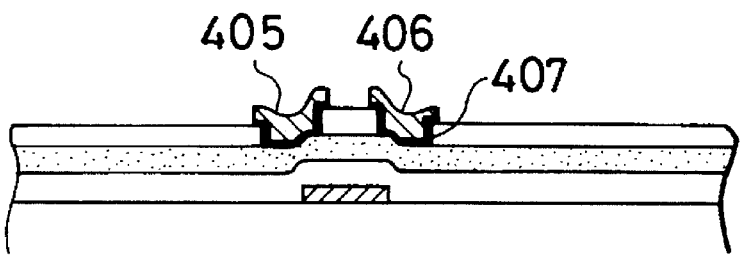

Next, as shown in FIG. 4(D), the electro-conductive layer is etched to form a source electrode 405 and a drain electrode 406 which are the main electrodes. Further, with the source electrode 405 and the drain electrode 406 as the mask, unnecessary impurity semiconductor layer 407 is removed.

Figure 4E:
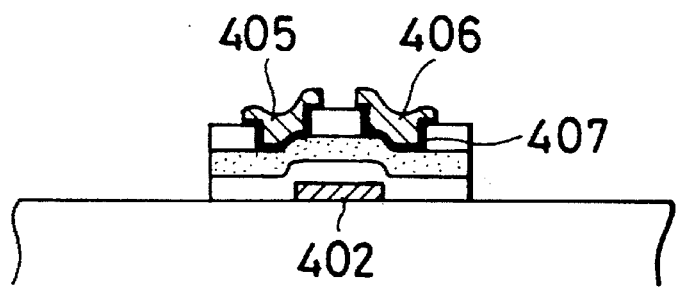

Next, as shown in FIG. 4(E), the first insulating layer 403, the semiconductor layer 404 and the second insulating layer 408 are simultaneously subjected to patterning with the same pattern to form a TFT.

In this embodiment, since no selective etching of semiconductor layer and insulating layer as practiced in the prior art is required, there is no instability accompanying selective etching to afford stable production steps.

Further, since the first insulating layer, the semiconductor layer and the second insulating layer are removed simultaneously with the same pattern after formation of the drain electrode, there occurs no such phenomenon of drop-off of the source electrode and the drain electrode from the stepped portion, even if positional discrepancy in patterns may occur between the source electrode, the drain electrode and the first insulating layer, the semiconductor layer and the second insulating layer. Thus, highly precise pattern alignment can be reduced to simplify the production steps and also improve reliability of wiring, namely the yield of the TFT. Also, in this embodiment, since the surface of the portion corresponding to the channel of TFT is covered with the second insulating layer from the beginning of the step, it will not receive any influence of various damages, contamination, etc. in the course of the step. This has an advantage because constantly stable transistor characteristics can be obtained.

FIGS. 5(A)–5(D) are longitudinal sectional views of the production steps showing an embodiment when the TFT obtained according to the process of the present invention is used for an active type liquid crystal device.

Figure 5A:
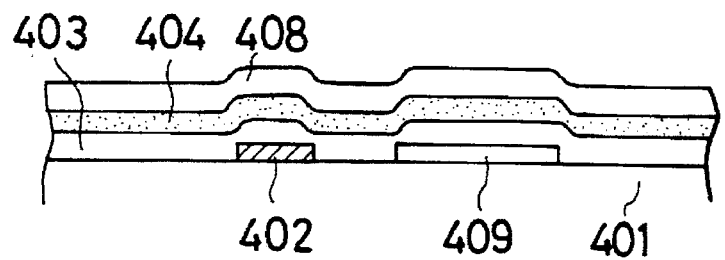
FIGS. 5(A)–5(D) are schematic longitudinal sectional views of production steps when the process for producing TFT of the present invention is used for the process for producing an active type liquid crystal device.

First, as shown in FIG. 5(A), on an insulating substrate 401 are formed a gate electrode 402 and a picture element electrode 409. Then, a first insulating layer 403, a semiconductor layer 404 and a second insulating layer 408 for insulation and protection are formed by lamination.

Figure 5B:
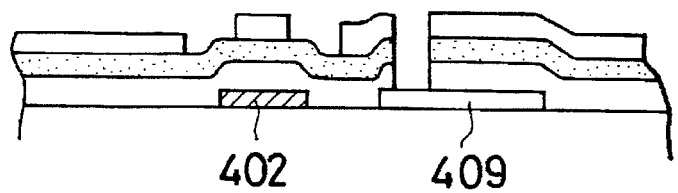

Next, as shown in FIG. 5(B), an opening portion for connecting a source electrode and a drain electrode to the semiconductor layer 403 and an opening portion for connecting a drain electrode to the picture element electrode 409 are provided.

Figure 5C:
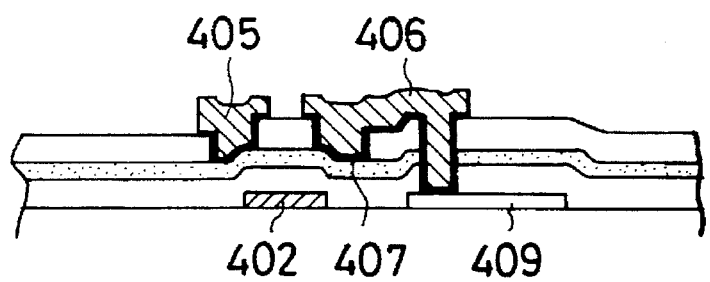

Next, as shown in FIG. 5(C), an impurity semiconductor layer 407 and an electro-conductive layer for an electrode are deposited, and a source electrode 405 and a drain electrode 406 are formed by patterning the electro-conductive layer similarly as in the step shown in FIG. 4(D) and described above. Likewise, the unnecessary impurity semiconductor layer is removed. In the case of having matrix wiring at the driving circuit portion of the liquid crystal display device, electrode wiring can be formed by similarly providing an opening portion.

The order of the step of providing opening portions and the step of depositing an impurity semiconductor as shown above in FIG. 5(B) and 5(C) can be reversed, making it possible to obtain a constitution in which no impurity semiconductor remains at the connecting portion between the picture element electrode and the drain electrode.

Figure 5D:
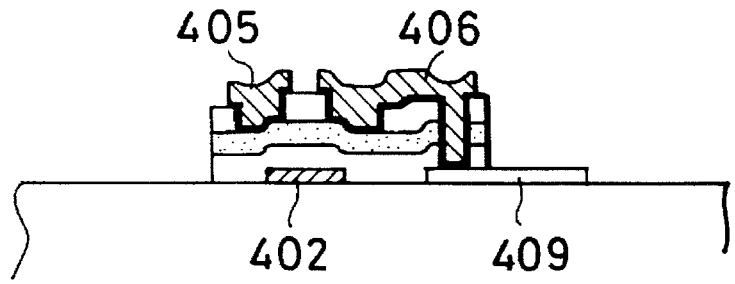

Next, as shown in FIG. 5(D), by subjecting the first insulating layer 403, the semiconductor layer 404 and the second insulating layer 408 to patterning with the same pattern, a TFT applied for an active type liquid crystal display device is formed.

This embodiment has the following advantage in addition to the advantages as mentioned in the embodiment shown in FIG. 4. That is, as shown in FIG. 5(D), since substantially no insulating layer exists on the picture element electrode 409, the voltage for driving the liquid crystal can be made smaller, whereby the load on the driving circuit power source can be alleviated.

FIGS. 6(A)–6(D) are schematic longitudinal sectional views of production steps showing one embodiment when the process for producing a TFT of the present invention is used for a transfer device of a photosensor device in an image reading device such as a facsimile.

Figure 6A:
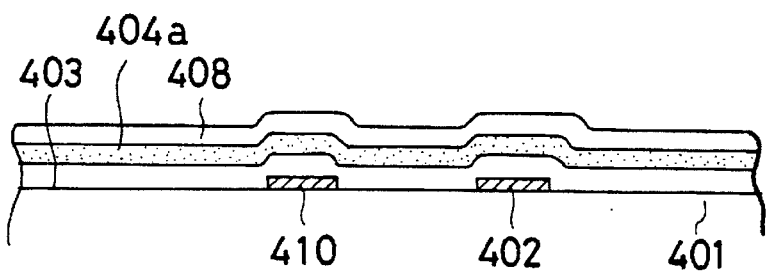
FIGS. 6(A)–6(D) are schematic longitudinal sectional views of production steps when the process for producing TFT of the present invention is used for the process for producing a transfer device of a photosensor in an image reading device such as a facsimile, etc.

First, as shown in FIG. 6(A), on an insulating substrate 401 are formed a gate electrode 402 of the TFT and a lower layer electrode 410 of a capacitor for the accumulation of image signals. Although not shown, electrodes for control may also be provided below the photosensor. Next, an insulating layer 403, a photoconductive semiconductor layer 404a and a second insulating layer 408 are formed by lamination.

Figure 6B:
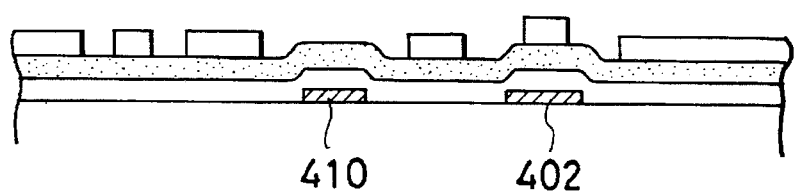

Next, as shown in FIG. 6(B), an opening portion for connecting a source electrode and a drain electrode in the TFT is shown. An opening portion for connecting the upper electrode of the accumulating capacitor and an opening portion for connecting the upper electrode of the photosensor are provided on the photoconductive semiconductor 404a. It is also possible to use a constitution in which no opening portion for connecting the upper electrode of the accumulating capacitor is provided.

Figure 6C:
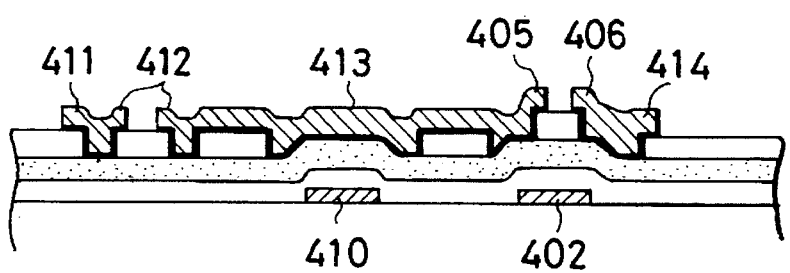

Next, as shown in FIG. 6(C), an impurity semiconductor layer and an electro-conductive layer for the electrode are deposited as in the step shown in FIG. 4(D), and described above. By patterning of the electro-conductive layer, a power supplying wire 411, sensor individual electrodes 412, an accumulating capacitor upper layer electrode 413, a source electrode 405 of TFT, a drain electrode 406 and a signal take-out wire 414 and wires for connecting the respective members are formed. Once again, the unnecessary impurity semconductor layer is removed.

Figure 6D:
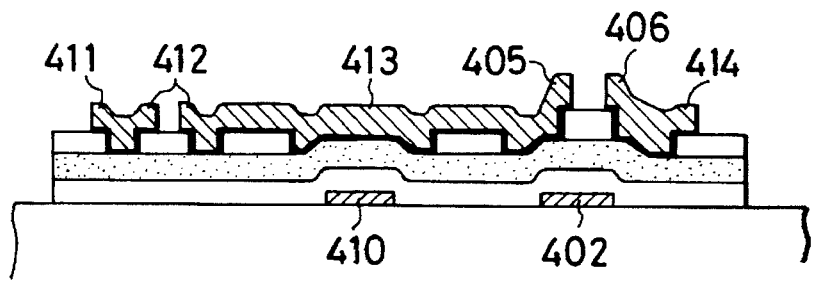

Next, as shown in FIG. 6(D), by subjecting simultaneously the first insulating layer 403, the photoconductive semiconductor layer 404a and the second insulating layer 408 to patterning with the same pattern, a photosensor having a TFT for transfer can be formed.

This embodiment has the following advantages as compared with the photosensor of the prior art.

That is, similarly as in the embodiment shown in FIG. 4, no selective etching of the semiconductor layer and the insulating layer is required. Thus, there is no instability accompanying selective etching to afford stable production steps. Further, since the first insulating layer, the semiconductor layer and the second insulating layer are removed simultaneously with the same pattern after formation of the source electrode and the drain electrode, there is no phenomenon of drop-off of the source electrode and the drain electrode from the stepped portion. This is the case even if positional discrepancy in patterns occur between the source electrode, the drain electrode, the first insulating layer, the semiconductor layer, and the second insulating layer. In this manner, a highly precise pattern alignment is not required to simplify the production steps and improve reliability of wiring, namely yield.

Also, since the surface of the portion corresponding to the channel of the TFT is covered with a protective layer from the beginning of the step, it will not become contaminated during the process steps. This has a great advantage in that constantly stable transistor characteristics and sensor characteristics can be obtained.

Figure 7A:
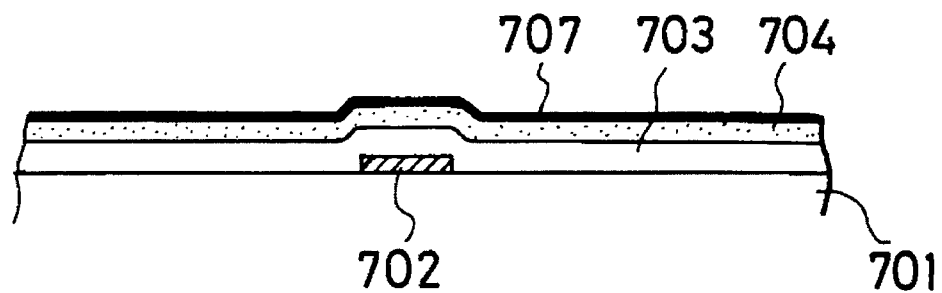
FIGS. 7(A)–7(C) are schematic longitudinal sectional views of production steps showing still another embodiment of the process for producing a TFT of the present invention.
Figure 7B:
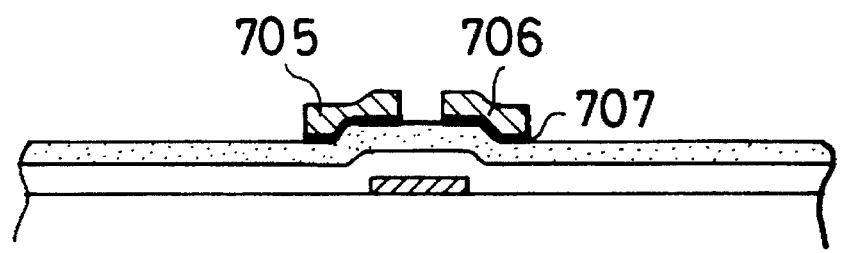
Figure 7C:
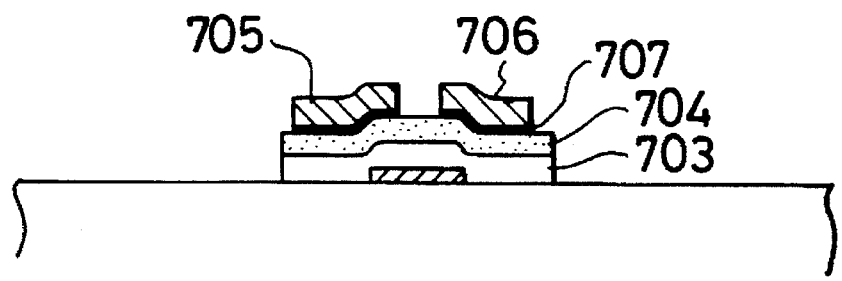

FIGS. 7(A)–7(C) are schematic longitudinal sectional views of production steps showing still another embodiment of the process for producing a TFT of the present invention.

First, as shown in FIG. 7(A), a gate electrode 702 which is the control electrode is formed on an insulating substrate 701. On the gate electrode 702 and the insulating substrate 701, an insulating layer 703 such as of silicon nitride, silicon oxide, etc. is formed. On this insulating layer a semiconductor layer 704 such as of polycrystalline silicon, amorphous silicon, etc. is formed, followed further by formation of an impurity semiconductor layer 707 doped with an element such as phosphorus, etc. which makes ohmic contact with the source electrode and the drain electrode, successively by lamination.

Next, as shown in FIG. 7(B), an electro-conductive layer for an electrode is formed by deposition and by subjecting the electro-conductive layer and the impurity semiconductor layer to patterning, the source electrode 705 and the drain electrode 706, which are main electrodes, are formed.

Next, as shown in FIG. 7(C), the insulating layer 703 and the semiconductor layer 704 are subjected to patterning at the same time with the same pattern to form a TFT.

In this embodiment, since no selective etching of the semiconductor layer and the insulating layer as practiced in the prior art example is required, there is no instability accompanying selective etching to afford stable production steps.

Further, since the insulating layer and the semiconductor layer are removed with the same pattern after formation of the source electrode and the drain electrode, there occurs no phenomenon of drop-off of the source electrode and the drain electrode from the stepped portion. This is the case even if positional discrepancy in patterns may occur between the source electrode, the drain electrode and the insulating layer, and the semiconductor layer. In this manner, a highly precise pattern alignment is not required to simplify the production steps and improve reliability of wiring, namely yield.

Also, since the above step of simultaneously removing the insulating layer and the semiconductor layer also functions as the step of exposing a part of the gate electrode, the etching step added for exposing a part of the gate electrode in the process for producing TFT of the prior art can be obviated to reduce the number of steps.

FIGS. 8(A)–8(D) are schematic longitudinal sectional views of preparation steps showing still another embodiment of the process for producing a TFT of the present invention when used for production of an active type liquid crystal display device.

Figure 8A:
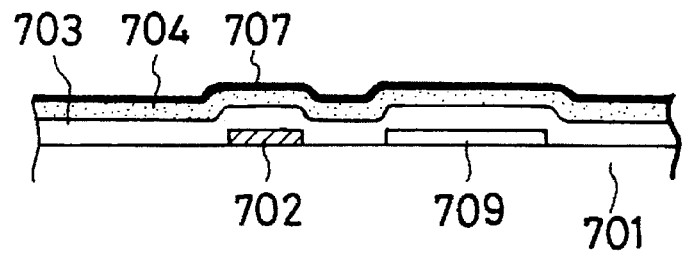
FIGS. 8(A)–8(D) are schematic longitudinal sectional views of production steps showing another embodiment when the process for producing TFT of the present invention is used for a process for producing an active type liquid crystal display device.

First, as shown in FIG. 8(A), a gate electrode 702 and a picture element electrode 709 are formed on an insulating substrate 701. Next, an insulating layer 703, a semiconductor layer 704 and an impurity semiconductor layer 707 are formed by lamination.

Figure 8B:
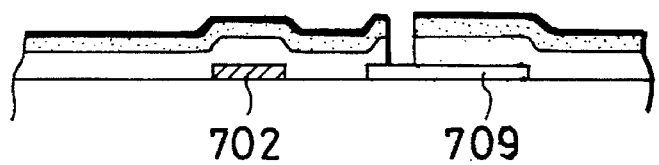

Next, as shown in FIG. 8(B), an opening portion for connecting a drain electrode 706 to the picture element electrode 709 is provided.

Figure 8C:
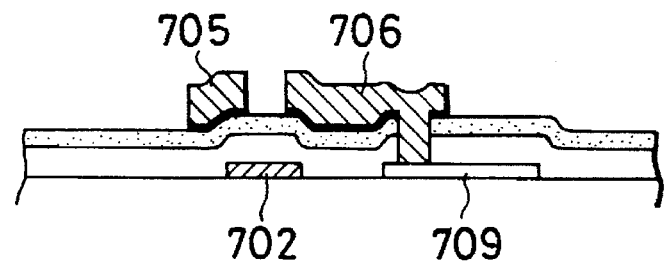

Next, as shown in FIG. 8(C), a source electrode 705 and a drain electrode 706 are formed. In the case of a constitution having a matrix wiring at the driving circuit portion of the liquid crystal display device, an opening portion can also be provided to form an electrode wiring.

Figure 8D:
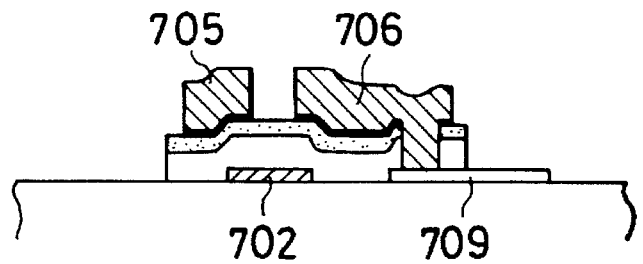

Next, as shown in FIG. 8(D), by simultaneously subjecting the insulating layer 703 and the semiconductor layer 704 to patterning with the same pattern, a TFT applied for an active type liquid crystal display device is formed.

This embodiment has the following advantage in addition to the advantages as mentioned in the embodiment as shown in FIG. 7. That is, while an insulating layer exists on the picture element electrode in the prior art, substantially no insulating layer exists on the picture element electrode 709 as shown in FIG. 8(D), and therefore the voltage for driving the liquid crystal can be made smaller to alleviate the load on the driving circuit power source.

Figure 9A:
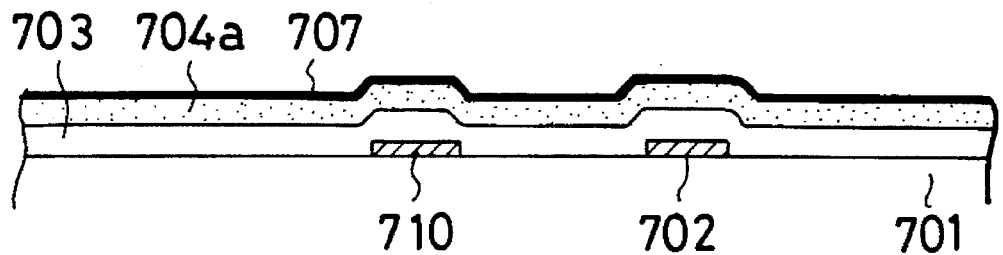
FIGS. 9(A)–9(C) are schematic longitudinal sectional views of production steps showing still another embodiment when the process for producing a TFT is used for a process for producing a transfer device of photosensor in an image reading device such as a facsimile, etc.
Figure 9B:
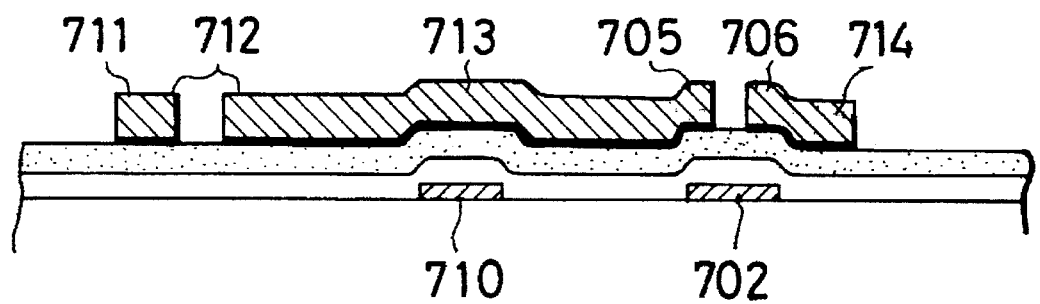
Figure 9C:
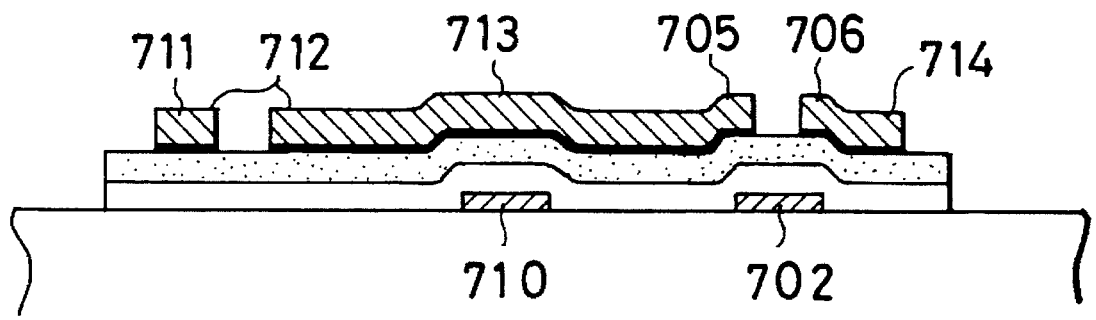

FIGS. 9(A)–9(C) are schematic longitudinal sectional views of preparation steps showing still another embodiment of the process for producing a TFT of the present invention when employed for production of a transfer device of a photosensor in an image reading device such as a facsimile, etc.

First, as shown in FIG. 9(A), a gate electrode 702 of TFT and a lower layer electrode 710 of a capacitor for accumulation of image signals are formed on an insulating substrate 701. Although not shown, it is also possible to provide electrodes for control below the photosensor. Next, an insulating layer 703, a photoconductive semiconductor layer 704a and an impurity semiconductor layer 707 are formed by lamination.

Next, as shown in FIG. 9(B), an electroconductive layer for an electrode is deposited, and the electroconductive layer and the impurity semiconductor layer are subjected to patterning to form a power source supplying wire 711, individual sensor electrodes 712, an accumulating capacitor upper layer electrode 713, a source electrode 705, a drain electrode 706 of a TFT, a signal take-out wire 714 and wires for connecting respective members.

Next, as shown in FIG. 9(C), the insulating layer 703 and the photoconductive semiconductor layer 704a are simultaneously subjected to patterning with the same pattern to form a photosensor having a TFT for transfer.

This embodiment has the following advantage in addition to the advantages as mentioned in the embodiment as shown in FIG. 8.

In the prior art, the stepped difference is formed because the photoconductive semiconductor layer is subjected to patterning. In the present invention, as shown in FIG. 9(C), since the insulating layer 703 and the semiconductor layer 704a are left to remain beneath the wiring for connecting the photosensor, the capacitor for accumulation and the TFT, there is substantially no stepped difference. This enables the wiring to be arranged smoothly and be highly reliable. This in turn contributes advantageously to improvement of the yield.

Also, since the insulating layer 703 and the semiconductor layer 704 receiving no influence of selective etching are left to remain as such beneath the capacitor for accumulation, the risk of leak between the upper and lower electrodes of the capacitor for accumulation can be markedly reduced, thus further contributing to improvement of yield of the whole device.

What we claim is:

1. An image reading device comprising a substrate, a photosensor portion having a pair of electrodes and a transistor portion for signal transfer, said photosensor portion comprising a first insulating layer provided on said substrate and a first semiconductor layer provided on said first insulating layer, said transistor portion comprising a gate electrode provided on said substrate, a second insulating layer provided on said gate electrode, a second semiconductor layer provided on said second insulating layer and source and drain electrodes electrically connected to said second semiconductor layer; and a third insulating layer of an electrically insulating material disposed on said first semiconductor layer of the photosensor portion and said second semiconductor layer of the transistor portion, said first insulating layer of said photosensor portion, said second insulating layer of said transistor portion being constituted of a common insulating layer, said first semiconductor layer of said photosensor portion, said second semiconductor layer of said transistor portion being constituted of a common semiconductor layer, the common insulating layer being coextensive with the common semiconductor layer and the third insulating layer having the same shape as the common semiconductor layer.

2. A device according to claim 1, wherein said photosensor portion further comprises a central electrode.

3. A device according to claim 1, further comprising a signal accumulating portion.

4. A device according to claim 1, wherein said semiconductor layer is constituted of one of polycrystalline silicon and amorphous silicon.

5. A device according to claim 1, wherein said insulating layer is constituted of one of silicon nitride and silicon oxide.

6. A device according to claim 1, wherein said pair of electrodes are provided on said semiconductor layer via an impurity semiconductor layer in ohmic contact therewith.

7. A device according to claim 1, wherein said source and drain electrodes are provided on said semiconductor layer via an impurity semiconductor layer in ohmic contact therewith.

8. An image reading device comprising a substrate, a photosensor portion having a pair of electrodes, a capacitor portion for signal accumulation, and a transistor portion for signal transfer;

said photosensor portion comprising a first insulating layer provided on said substrate and a first semiconductor layer provided on said first insulating layer;

said capacitor portion comprising an electrode provided on said substrate, a second insulating layer provided on said electrode, a second semiconductor layer provided on said second insulating layer and an electrode provided on said second semiconductor layer;

said transistor portion comprising a gate electrode provided on said substrate, a third insulating layer provided on said gate electrode, a third semiconductor layer provided on said third insulating layer and source and drain electrodes electrically connected to said third semiconductor layer; and a fourth insulating layer provided between said pair of electrodes, between said source electrode and said drain electrode, and between said photosensor, said capacitor and said transistor portions;

said first insulating layer of said photosensor portion, said second insulating layer of said capacitor portion and said third insulating layer of said transistor portion being constituted of a common insulating layer and said first semiconductor layer of said photosensor portion, said second semiconductor layer of said capacitor portion and said third semiconductor layer of said transistor portion being constituted of a common semiconductor layer; and the fourth insulating layer and the common insulating layer being coextensive with the common semiconductor layer.

9. A device according to claim 8, wherein said photosensor portion further comprises a central electrode.

10. A device according to claim 8, wherein said semiconductor layer is constituted of one of polycrystalline silicon and amorphous silicon.

11. A device according to claim 8, wherein said insulating layer is constituted of one of silicon nitride and silicon oxide.

12. A device according to claim 8, wherein said pair of electrodes are provided on said semiconductor layer via an impurity semiconductor layer in ohmic contact therewith.

13. A device according to claim 8, wherein said source and drain electrodes are provided on said semiconductor layer via an impurity semiconductor layer in ohmic contact therewith.

14. An image reading device according to claim 8, wherein the common insulating layer has the same pattern as the common semiconductor layer.

15. An image reading device according to claim 7, wherein said impurity semiconductor layer and said source and drain electrodes in contact with said impurity semiconductor layer have the same shape.

16. An image recording device according to claim 13, wherein said impurity semiconductor layer and said source and drain electrodes in contact with said impurity semiconductor layer have the same shape.

17. A semiconductor substrate for an active matrix type liquid crystal display device, comprising:

a common supporting member;

a plurality of thin film transistors each comprising a gate electrode provided on said common supporting member, a first insulating layer provided on said gate electrode, a first non-doped or substantially non-doped semiconductor layer provided on said first insulating layer, and source and drain electrodes provided on said first semiconductor layer via an ohmic contact layer;

a plurality of capacitors provided in one-to-one correspondence with said plurality of thin film transistors, each of said plurality of capacitors comprising a pair of electrodes and a second non-doped or substantially non-doped semiconductor layer and a second insulating layer sandwiched between said pair of electrodes, said first and second semiconductor layers being constituted of a common semiconductor layer, and said first and second insulating layers being constituted of a first common insulating layer, wherein one of said pair of electrodes is electrically connected to one of said source and drain electrodes; and a third insulating layer provided on said first semiconductor layer between said source and drain electrodes of each of said thin film transistors and a fourth insulating layer provided on said common semiconductor layer between each of said thin film transistors and said corresponding capacitor, said third and fourth insulating layers being constituted of a second common insulating layer, different from said first common insulating layer, said second common insulating layer being substantially coextensive with said first insulating layer of each said thin film transistors and said second insulating layer of said corresponding capacitor.

18. A semiconductor substrate according to claim 17, wherein said common semiconductor layer comprises amorphous silicon.

19. A semiconductor substrate according to claim 17, wherein the first semiconductor layer of said thin film transistor and the second semiconductor layer of the corresponding capacitor being constituted of the common semiconductor layer are formed in the same formation step.

20. A semiconductor substrate according to claim 17, wherein the first insulating layer of said thin film transistor and the second insulating layer of the corresponding capacitor being constituted of the first common insulating layer are formed in the same formation step.

* * * * *